United States Patent [19]
Melf

[11] Patent Number: 6,102,365
[45] Date of Patent: Aug. 15, 2000

[54] ACTUATING DRIVE FOR A PNEUMATIC VALVE OF AN INSERTION HEAD FOR ELECTRICAL COMPONENTS

[75] Inventor: Johann Melf, Muensing, Germany

[73] Assignee: Siemens Aktiengesellschaft, Munich, Germany

[21] Appl. No.: 09/114,849

[22] Filed: Jul. 14, 1998

[30] Foreign Application Priority Data

Mar. 30, 1998 [DE] Germany .......................... 198 14 159

[51] Int. Cl.$^7$ ................................................. F16K 31/02
[52] U.S. Cl. ..................................... 251/129.06; 294/64.1
[58] Field of Search ......................... 251/129.06, 129.01; 294/64.1

[56] References Cited

U.S. PATENT DOCUMENTS

| | | |
|---|---|---|
| 5,125,152 | 6/1992 | Grasmueller et al. ............. 294/64.1 X |
| 5,228,732 | 7/1993 | Rauscher ............................. 294/64.1 X |
| 5,593,134 | 1/1997 | Steber et al. .................... 251/129.06 X |
| 5,883,357 | 3/1999 | Newman et al. .................. 294/64.1 X |

*Primary Examiner*—Kevin Lee
*Attorney, Agent, or Firm*—Hill & Simpson

[57] ABSTRACT

An actuating drive for a pneumatic valve of an insertion head for electrical components having a revolver type movable insertion head for the electrical components which includes suction pipettes which protrude in a stellate fashion and which can be rotated successively into a placement attitude for each respective component. A valve is allocated to each of the suction pipettes which switches its suction air over to blowing air following placement of the component on a components carrier. The valve is actuated by a piezoelectric flex transducer anchored at a stator of the insertion head.

4 Claims, 1 Drawing Sheet

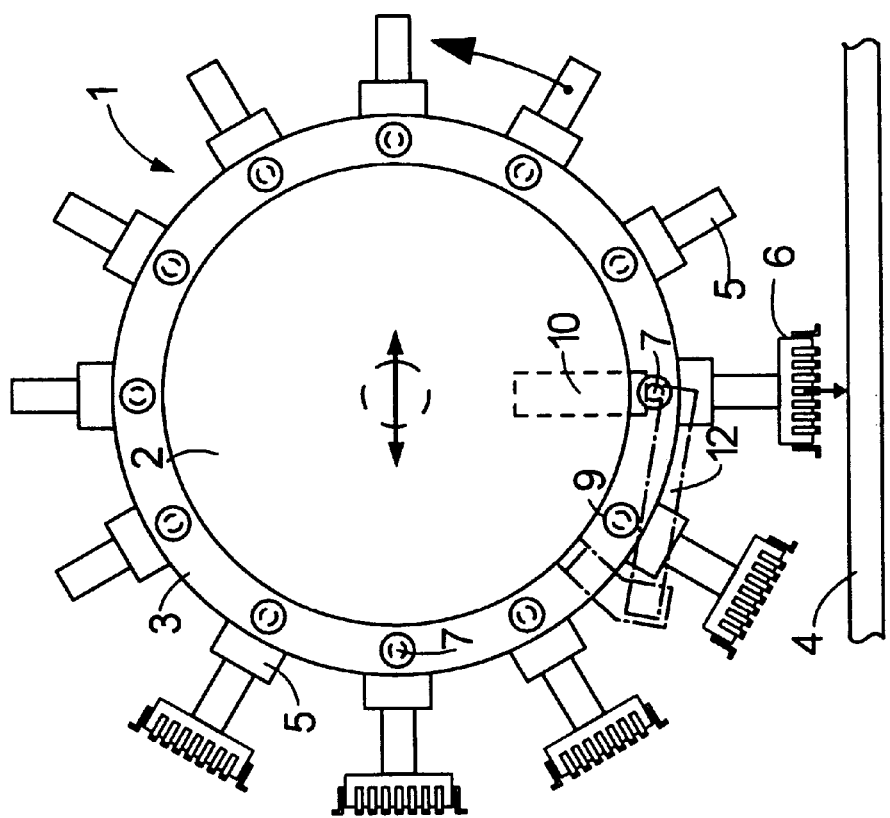
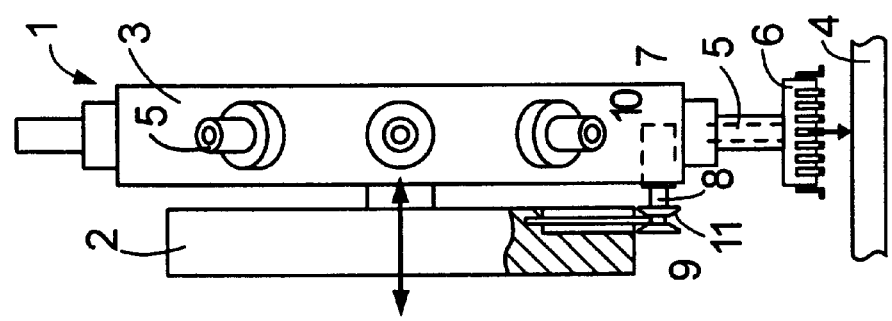
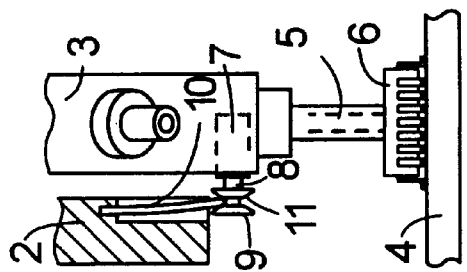

ACTUATING DRIVE FOR A PNEUMATIC VALVE OF AN INSERTION HEAD FOR ELECTRICAL COMPONENTS

BACKGROUND OF THE INVENTION

1. Field of the Invention

The present invention relates to an actuating drive for a pneumatic valve of a revolver type movable insertion head for placing electrical components on to a components carrier. The insertion head includes a stator and a rotor mounted thereat which can be driven in an indexed fashion and which is provided with a plurality of suction pipettes for the components wherein the pipettes protrude in a circular fashion and are successively rotatable into a placement attitude.

2. Description of the Prior Art

DE 196 04 603 C2 teaches a revolver head in which a control valve is allocated to each suction pipette for changing the pressure relations in the suction pipette. A valve drive is anchored at the stator of the insertion head wherein the drive becomes engaged with displaceable control parts of the valve; this being exactly in the placement attitude. The valve drive consists of a stepping motor at whose primary shaft a crankshaft journal with a rolling bearing is provided. The journal projects between two radially protruding cross-ribs of a control slide of the valve wherein the slide attitude can be displaced through a changing of the rotary position of the crankshaft journal. The outer diameter of the rolling bearing is considerably smaller than the distance between the cross-ribs in order to enable return stroke of the crankshaft journal. In the swinging of the suction pipettes into the placement attitude, the crankshaft journal arrives between the two cross-ribs wherein there is no problem in mutual attitudinal adjustment as a result of the large curvature of the rolling bearing and of the lateral play to the cross-ribs.

SUMMARY OF THE INVENTION

It is therefore an object of the present invention to simplify the actuating drive of such a pneumatic valve and to reduce its mass and space requirement. Accordingly, in an embodiment of the present invention, a piezoelectric flex transducer is constructed as a simple purchased part which is of low mass and small dimensions and is obtained in a cost-effective manner. It is thus particularly suitable for an insertion head which can be driven according to coordinates and which is of optimally small mass and dimensions. The flex transducer can be laterally deflected in a very short switching time through simple application of an operating voltage. This transducer only must be securely fixed at the stator at one end—it needs no other support or guidance—and can directly dislocate the slide. The insertion performance of the insertion head can be increased corresponding to the short switching time.

In order to be able to fully exploit the excursion path of the free end, the contact play between the free end and the operating elements is advantageously kept optimally small. Through the run-in bevel, the capture range of the swinging operating element is enlarged so much that considerable positional deviations can be compensated for. Following the lifting of the suction pipette from the placed component, the operating voltage of the flex transducer is switched off, whereupon this resumes the starting position due to its springing properties. It is possible to intensify the readjusting force, and so to shorten the readjustment time, through the short-term application of a voltage with reversed poles.

In an alternative embodiment, the slide is not only activated by the flex transducer, but also reset by the latter's backspring into the starting position. For this process, the operating voltage must be merely switched off without requiring another external influence.

In yet another embodiment of the present invention, the flex transducer can be constructed as a simple smooth leaf spring whose ends project between the two shoulders with little play.

In a further embodiment, a free overhand of the flex transducer projects between the two shoulders such that the slide slides past the overhang. In the tangential arrangement, a narrow longitudinal side of the flex transducer faces in such a way in the region of its free end that this slides by at a small distance. This arrangement enables a beveled insertion of the shoulders into the overlap region of the flex transducer.

Additional features and advantages of the present invention are described in, and will be apparent from, the Detailed Description of the Preferred Embodiments and the Drawings.

DESCRIPTION OF THE DRAWINGS

FIG. 1 shows a side view of a revolver type insertion head in accordance with the teachings of the present invention.

FIG. 2 shows another side view of the insertion head of FIG. 1.

FIG. 3 shows another partial view of the insertion head of FIG. 2 in another functional attitude.

DETAILED DESCRIPTION OF THE PREFERRED EMBODIMENTS

According to FIGS. 1 and 2, a revolver type insertion head 1 includes a stator 2, which can be moved in two coordinate directions according to the horizontal double arrows, upon which a rotor 3 is rotatably mounted. Beneath the insertion head 1, there is a components carrier constructed as a printed board 4. The rotor 3 is provided with a plurality of suction pipettes 5 for electrical components 6. The pipettes protrude radially in a stellate fashion and can be gradually rotated according to the curved arrow such that the components 6 can be successively rotated into a placement position over the printed board 4. Each of the suction pipettes 5 is allocated its own pneumatic valve 7 which connects the suction pipettes 5 to vacuum in an operating position.

The suction pipette 5 located in the placement attitude is lowered to the printed board 4, whereupon the vacuum present in the suction pipette 5 is switched over to blowing air by means of the pneumatic valve 7. The valves 7 respectively include a slide 8 which can be moved parallel to the axle direction of the rotor 3 and which can be dislocated between a suction and blowing air position in a working stroke. The slide 8 is provided with two disks 9 protruding radially in a dish-like fashion and which are spaced a small separating distance from each other.

At the stator 2, a piezoelectric flex transducer 10 is secured whose inner end is fixed securely at the stator 2 wherein the transducer is oriented radially to the main axle of the insertion head. The flex transducer 10, in the fashion of a leaf spring, projects with its free end with little play between the two disks 9 of the valve 7 located in the placement attitude. At the side facing the free end of the flex transducer 10, the two disks 9 include run-in bevels 11 which stand in a "V" shape with respect to each other and which mutually center the slide 8 given a swinging into the placement attitude. The component 6 located over the printed board 4 can now be placed onto the printed board 4 through ejection of the suction pipette 5 from the rotor 3 according to the vertical arrow.

According to FIG. 3, the component 6 is placed directly on the printed board 4. An operating voltage is applied at the piezoelectric flex transducer 10, which leads to a deflection of the leaf spring type flex transducer 10. Accepting the slide 8, the transducer's free end is thereby made to perform an excursion toward the valve 7 wherein the valve is switched over from suction air to blowing air. It is thereby achieved that, in the withdrawing of the suction pipette, the component 6 does not cling thereto, but rather is held in its final position on the printed board 4.

The dot-and-dash lines in FIG. 1 indicate the holding device and excerpts of an alternatively arranged flex transducer 12 which is arranged tangentially to the rotational direction of the valve 7 such that with a narrow longitudinal side the free end of the transducer projects from the outside between the disks 9 and the slide 8. The unfree end of the flex transducer 12 is located on the side of the flex transducer 12 facing the incoming valve 7.

Although the present invention has been described with reference to specific embodiments, those of skill in the art will recognize that changes may be made thereto without departing from the spirit and scope of the invention as set forth in the hereafter appended claims.

I claim as my invention:

1. An actuating drive for a pneumatic valve of a revolver-type movable insertion head for placement of electrical components onto a components carrier wherein the insertion head includes a stator and a rotor mounted thereat which can be actuated in an indexed fashion and which is provided with a plurality of circularly protruding suction pipettes which can be successively rotated into a placement attitude for the components, wherein a displaceable valve is allocated to each of the suction pipettes for changing the pressure relations in the suction pipette, wherein the actuating drive is anchored at the stator which becomes engaged in the placement attitude with displaceable operating elements of the valve where the elements are each provided with at least one run-in bevel, the actuating drive comprising a freely projecting flex transducer having a piezoelectric leaf spring securely anchored at a first end to the stator and which projects at a second end into an engagement region of the operating elements, the piezoelectric leaf spring positioned substantially perpendicular to an actuation direction of the valve.

2. An actuating drive as claimed in claim 1, wherein a slide projects from a housing of the valve, the slide including the operating elements which are constructed as shoulders provided with the run-in bevels, the shoulders standing perpendicular to a direction of valve displacement and having a portion located in the placement attitude mutually engaging the second end of the flex transducer with little play.

3. An actuating drive as claimed in claim 2, wherein the shoulders are constructed as two disks protruding from the slide in a dish-like manner and between the two disks the flex transducer projects with little play, and wherein the run-in bevels are constructed at mutually-opposing shoulders of the two disks.

4. An actuating drive as claimed in claim 1, wherein the flex transducer is oriented radially or tangentially to a direction of rotation of the valve.

* * * * *